United States Patent
Jian et al.

(10) Patent No.: US 11,871,646 B2
(45) Date of Patent: Jan. 9, 2024

(54) DISPLAY SUBSTRATE AND METHOD OF MANUFACTURING THE SAME

(71) Applicants: MIANYANG BOE OPTOELECTRONICS TECHNOLOGY CO., LTD., Sichuan (CN); BOE TECHNOLOGY GROUP CO., LTD., Beijing (CN)

(72) Inventors: Shuaimin Jian, Beijing (CN); Qinglin Ma, Beijing (CN); Yan Zhao, Beijing (CN); Lubiao Sun, Beijing (CN); Yue Feng, Beijing (CN)

(73) Assignees: MIANYANG BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 314 days.

(21) Appl. No.: 17/465,100

(22) Filed: Sep. 2, 2021

(65) Prior Publication Data
US 2022/0093883 A1     Mar. 24, 2022

(30) Foreign Application Priority Data
Sep. 18, 2020   (CN) .......................... 202010987419.6

(51) Int. Cl.
*H10K 77/10*     (2023.01)
*H10K 30/30*     (2023.01)
(Continued)

(52) U.S. Cl.
CPC ......... *H10K 77/111* (2023.02); *H10K 30/353* (2023.02); *H10K 71/00* (2023.02);
(Continued)

(58) Field of Classification Search
CPC .... H10K 77/111; H10K 30/353; H10K 71/00; H10K 85/40; H10K 2102/311;
(Continued)

(56) References Cited

U.S. PATENT DOCUMENTS

2018/0040858 A1    2/2018  Chien et al.
2021/0328184 A1*  10/2021  Jung ................. H10K 50/8426
2021/0359139 A1   11/2021  Song et al.

FOREIGN PATENT DOCUMENTS

CN     110534666        12/2019
CN     110992823 A       4/2020

OTHER PUBLICATIONS

Second Office Action (w/ English translation) for corresponding Chinese Application No. 202010987419.6, dated Jan. 12, 2023, 12 pages.
(Continued)

*Primary Examiner* — J. E. Schoenholtz
(74) *Attorney, Agent, or Firm* — Dority & Manning, P.A.

(57) ABSTRACT

A display substrate has a display area, an opening area and an isolation area located between the display area and the opening area and surrounding the opening area, and the display area is disposed at least partially around the opening area. The display substrate includes a flexible base having a via hole located in the opening area. The flexible base includes an amorphous silicon layer. The amorphous silicon layer includes a first portion located in the isolation area and a second portion located in the display area, and a thickness of the first portion is greater than a thickness of the second portion.

20 Claims, 11 Drawing Sheets

(51) Int. Cl.
 *H10K 71/00* (2023.01)
 *H10K 85/40* (2023.01)
 *H10K 102/00* (2023.01)
(52) U.S. Cl.
 CPC ....... *H10K 85/40* (2023.02); *H10K 2102/311* (2023.02); *H10K 2102/351* (2023.02)
(58) Field of Classification Search
 CPC ........... H10K 2102/351; H10K 50/844; H10K 59/65; H10K 59/12; H10K 71/80; Y02E 10/549
 See application file for complete search history.

(56) References Cited

OTHER PUBLICATIONS

Chinese First Office Action (w/ English translation) for corresponding Chinese Application No. 202010987419.6, dated Jun. 22, 2022, 13 pages.

\* cited by examiner

DISPLAY SUBSTRATE AND METHOD OF MANUFACTURING THE SAME

CROSS-REFERENCE TO RELATED APPLICATION

This application claims priority to Chinese Patent Application No. 202010987419.6, filed on, Sep. 18, 2020, which is incorporated herein by reference in its entirety.

TECHNICAL FIELD

The present disclosure relates to the field of display technologies, and in particular, to a display substrate and a method of manufacturing the same.

BACKGROUND

An organic electroluminescent display is a display composing of a plurality of self-luminous organic light-emitting diodes (OLEDs), and has characteristics of no backlight source, high contrast, small thickness, wide viewing angle, fast response speed, applicability in a flexible substrate, wide temperature range, simple structure, ease of manufacturing and the like.

Moreover, flexible OLEDs may be applied to a foldable display apparatus, so that the display apparatus has various shapes to meet requirements in different usage scenarios.

SUMMARY

In an aspect, a display substrate is provided. The display substrate has a display area, an opening area and an isolation area located between the display area and the opening area and surrounding the opening area. The display area is disposed at least partially around the opening area. The display substrate includes a flexible base, and the flexible base has a via hole located in the opening area. The flexible base includes an amorphous silicon layer. The amorphous silicon layer includes a first portion located in the isolation area and a second portion located in the display area, and a thickness of the first portion being greater than a thickness of the second portion.

In some embodiments, the thickness of the first portion is 1.3 to 1.5 times the thickness of the second portion.

In some embodiments, the display substrate further includes at least one blocking dam disposed on the flexible base and located in the isolation area.

In some embodiments, the at least one blocking dam is in a shape of a ring, and is disposed around the opening area.

In some embodiments, the at least one blocking dam includes a plurality of blocking dams arranged at intervals in a direction from the display area to the opening area.

In some embodiments, heights of the plurality of blocking dams increase in the direction from the display area to the opening area.

In some embodiments, the display substrate further includes at least one separate pillar disposed on the flexible base and located in the isolation area.

In some embodiments, the at least one separation pillar includes one separation pillar, the separation pillar is located between the at least one blocking dam and the display area or between the at least one blocking dam and the opening area.

In some embodiments, the at least one separation pillar includes a first separation pillar and a second separation pillar disposed at intervals. The first separation pillar is located between the at least one blocking dam and the display area, and the second separation pillar is located between the at least one blocking dam and the opening area.

In some embodiments, a height of the second separation pillar is greater than a height of the first separation pillar.

In some embodiments, the at least one separation pillar is in a shape of a ring, and is disposed around the opening area.

In some embodiments, the flexible base further includes a first flexible layer and a first silicide layer. The first flexible layer is disposed on a side of the amorphous silicon layer, and the first silicide layer is disposed between the first flexible layer and the amorphous silicon layer.

In some embodiments, a material of the first silicide layer includes silicon oxide.

In some embodiments, a material of the first flexible layer includes polyimide.

In some embodiments, the flexible base further includes a second flexible layer and a second silicide layer. The second flexible layer is disposed on a side of the amorphous silicon layer away from the first silicide layer, and the second silicide layer is disposed on a side of the second flexible layer away from the amorphous silicon layer.

In some embodiments, a material of the second flexible layer includes polyimide.

In some embodiments, a material of the second silicide layer includes silicon oxide.

In another aspect, a method of manufacturing a display substrate is provided. The display substrate is the display substrate of any of the embodiments above. The method includes: providing a rigid carrier and forming the flexible base on the rigid carrier. Forming the flexible base on the rigid carrier includes: forming an amorphous silicon layer to be processed, the amorphous silicon layer to be processed including the first portion located in the isolation area, the second portion located in the display area and a third portion located in the opening area, and thicknesses of the first portion and the third portion being both greater than the thickness of the second portion; scanning a surface of the rigid carrier away from the amorphous silicon layer to be processed once through a laser to separate the flexible base from the rigid carrier; and removing the third portion to form the amorphous silicon layer.

In some embodiments, the thickness of the third portion is 1.3 to 1.5 times the thickness of the second portion.

In some embodiments, the thickness of the third portion is equal to the thickness of the first portion.

BRIEF DESCRIPTION OF THE DRAWINGS

In order to describe technical solutions in the present disclosure more clearly, the accompanying drawings to be used in some embodiments of the present disclosure will be introduced briefly below. However, the accompanying drawings to be described below are merely accompanying drawings of some embodiments of the present disclosure, and a person of ordinary skill in the art can obtain other drawings according to these drawings. In addition, the accompanying drawings to be described below may be regarded as schematic diagrams, but are not limitations on an actual size of a product, and an actual process of a method involved in the embodiments of the present disclosure.

DETAILED DESCRIPTION

Figure 1A:
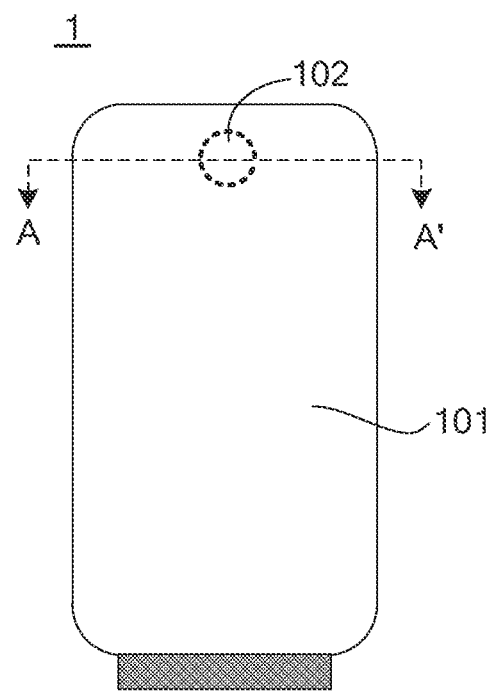
FIG. 1A is a schematic diagram showing a structure of an electronic apparatus, in accordance with some embodiments.

Technical solutions in some embodiments of the present disclosure will be described clearly and completely below with reference to the accompanying drawings. However, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Below, the terms "first", "second" and the like are only used for descriptive purposes, and are not to be construed as indicating or implying relative importance or implicitly indicating the number of indicated technical features. Thus, a feature defined with "first" or "second" may explicitly or implicitly include one or more of the features. As used in this specification and the appended claims, the singular forms "a/an" and "the" may also include plural referents unless the content clearly dictates otherwise. In the description of the embodiments of the present disclosure, the term "a/the plurality of" means two or more unless otherwise specified.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

In addition, the use of the phrase "based on" is meant to be open and inclusive, since a process, step, calculation or other action that is "based on" one or more of the stated conditions or values may, in practice, be based on additional conditions or values exceeding those stated.

Terms such as "about" or "approximately" as used herein includes a stated value and an average value within an acceptable range of deviation of a particular value. The acceptable range of deviation is determined by a person of ordinary skill in the art in view of the measurement in question and the error associated with the measurement of a particular quantity (i.e., the limitations of the measurement system).

It will be understood that, when a layer or an element is referred to as being on another layer or substrate, it may be directly on the another layer or substrate, or intermediate layer(s) may also be present.

Exemplary embodiments are described herein with reference to sectional views and/or plan views as idealized exemplary drawings. In the accompanying drawings, thicknesses of layers and regions are enlarged for clarity. Exemplary embodiments of the present disclosure should not be construed to be limited to shapes of regions shown herein, but to include deviations in shape due to, for example, manufacture. For example, an etched area shown as a rectangle generally has a curved feature. Therefore, the areas shown in the accompanying drawings are schematic in nature, and their shapes are not intended to show actual shapes of the area in a device, and are not intended to limit the scope of the exemplary embodiments.

Some embodiments of the present disclosure provide an electronic apparatus. The electronic apparatus may serve as any products or components having a display function such as a mobile phone, a tablet computer, a notebook computer, a personal digital assistant (PDA), a vehicle-mounted computer, or a television, the embodiments of the present disclosure do not limit thereto. For example, the electronic apparatus may further has an image capturing function.

Figure 1B:
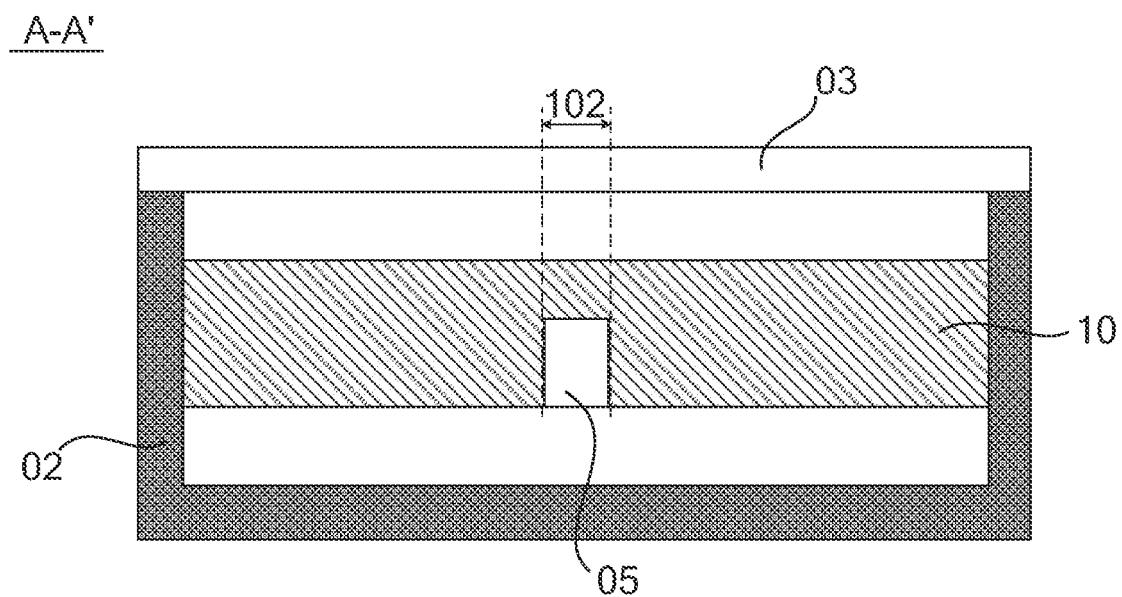
FIG. 1B is a sectional view of the electronic apparatus taken along the line A-A' in FIG. 1A.

In some embodiments, as shown in FIGS. 1A and 1B, the electronic apparatus 1 includes a display substrate 10, a frame 02, a cover glass 03, an image sensor 05 and other accessories. For example, as shown in FIG. 1B, a longitudinal section of the frame 02 is U-shaped, the cover plate 03 is located at an opening of the frame 02, and the flexible display substrate 10 and the image sensor 05 arranged in an opening of the display substrate 10 are disposed in a cavity enclosed by the frame 02 and the cover plate 03. A material of the cover plate 03 is a flexible material, such as ultra-thin glass. The flexible display substrate 10 enables the electronic apparatus to be foldable to meet different usage scenarios.

It will be understood that, the image sensor 05 in the above embodiments may be replaced with other devices, such as any one of an infrared sensor, a handset, a physical key (e.g., a key for fingerprint recognition), or a pointer axis. As another example, in the electronic apparatus 1 in the above embodiments, the display substrate 10 has more openings to accommodate the image sensor 05 and other devices.

For example, the electronic apparatus 1 includes a liquid crystal display, an organic light emitting diode display, a quantum dot light emitting diode display or a micro light emitting diode (Micro-LED) display, the embodiments of the present disclosure do not limit thereto.

The following embodiments are illustrated only by taking an example in which the electronic apparatus 1 includes an organic light emitting diode display.

In some examples, the image sensor 05 is a camera. For example, the image sensor 05 is disposed in a surface of the display substrate 10 facing away from the cover plate 03.

As shown in FIGS. 1A and 1B, the display substrate 10 in the electronic apparatus 1 has a display area 101 for display and an opening area 102 for accommodating a device, such as the image sensor 05. For example, as shown in FIG. 1A, a shape of the opening area 102 is a circle.

The embodiments of the present disclosure do not limit the shape of the opening area 102, which may be set according to a shape of the device (e.g., image sensor 05). For example, if the shape of the image sensor 05 is a rectangle, the shape of the opening area 102 may also be set as a rectangle.

The embodiments of the present disclosure do not limit the number of opening area 102, which may be set according to requirements of the device (e.g., image sensor 05).

Some embodiments of the present disclosure provide a display substrate, which may be applied to the electronic apparatus 1.

Figure 2A:
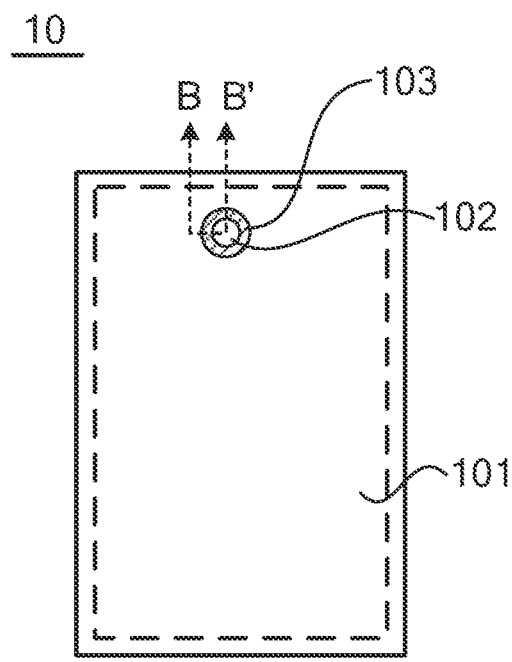
FIG. 2A is a top view of a display substrate, in accordance with some embodiments.
Figure 2B:
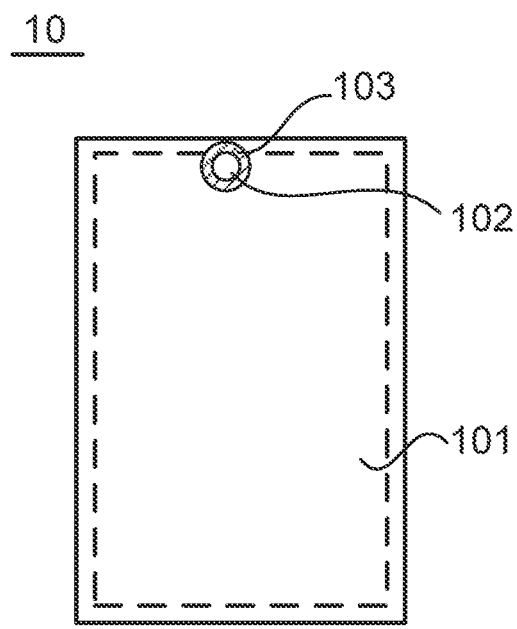
FIG. 2B is a top view of another display substrate, in accordance with some embodiments.

As shown in FIGS. 2A and 2B, the display substrate 10 has a display area 101 and an opening area 102. For example, as shown in FIG. 2A, the display area 101 is disposed around the opening area 102. For another example, as shown in FIG. 2B, the opening area 102 is disposed at an edge of the display substrate 10, and the display area 101 is disposed partially around the opening area 102. The embodiments of the present disclosure do not limit the positional relationship between the display area 101 and the opening area 102, which may be set according to actual needs of the electronic apparatus 1 to capture images.

Figure 3:
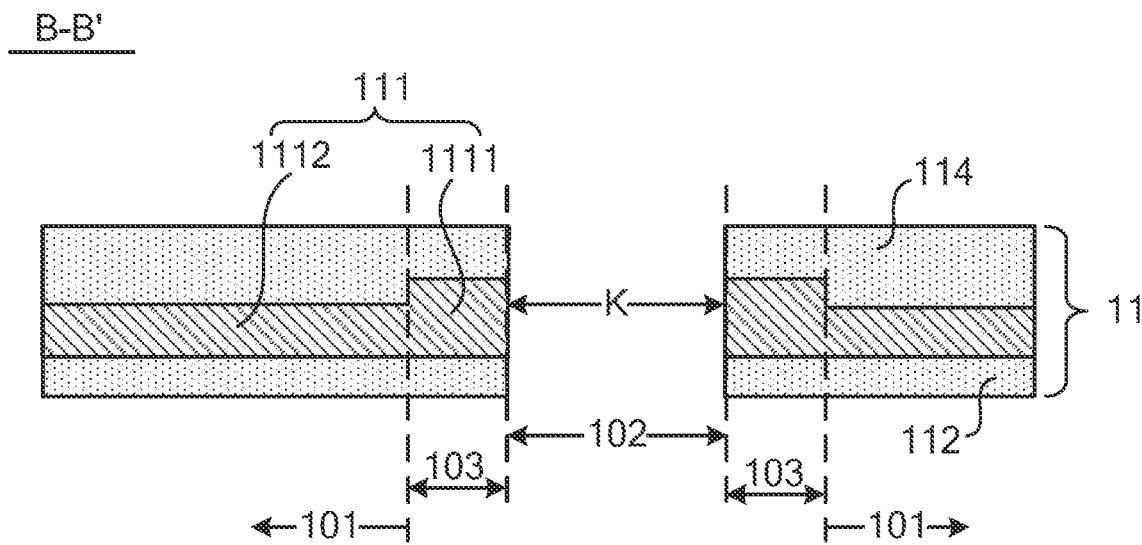
FIG. 3 is a sectional view of a flexible base in the display substrate taken along the line B-B' in FIG. 2A.

As shown in FIG. 3, the display substrate 10 includes a flexible base 11 having a via hole K located in the opening area 102. The image sensor 05 (not shown in FIG. 3) may be installed in the via hole K.

Based on this, the display substrate 10 further includes an isolation area 103 located between the display area 101 and the opening area 102 and surrounding the opening area 102. The isolation area 103 is used to block moisture, oxygen and the like in the air, so as to prevent moisture, oxygen and the like from entering the display area 101 through the via hole K located in the opening area 102.

A shape of the isolation area 103 may be set according to the shape of the opening area 102. For example, as shown in FIGS. 2A and 2B, the shape of the opening area 102 is a circle, and the shape of the isolation area 103 is a circular ring. For another example, the shape of the opening area 102 is a rectangle, and the shape of the isolation area 103 may be a rectangular ring or a circular ring. The embodiments of the present disclosure do not limit the shape of the isolation area 103, as long as it may be set to surround the opening area 101.

As shown in FIG. 3, the flexible base 11 includes an amorphous silicon (a-Si) layer 111. The amorphous silicon layer 111 includes a first portion 1111 located in the isolation area 103 and a second portion 1112 located in the display area 101. A thickness of the first portion 1111 is greater than a thickness of the second portion 1112. It will be understood that since the flexible base 11 has the via hole K located in the opening area 102, the via hole K penetrates through the amorphous silicon layer 111.

Figure 4A:
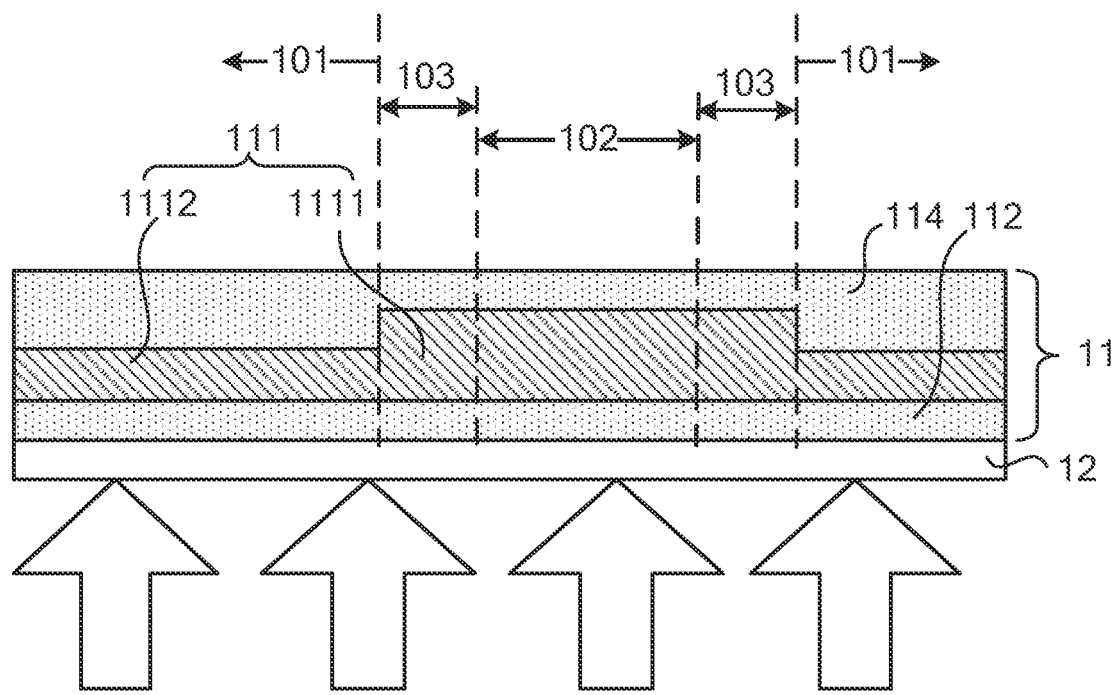
FIGS. 4A to 4C are schematic diagrams of process of separating the flexible base in FIG. 3 from a rigid carrier through a laser lift-off technology.
Figure 4B:
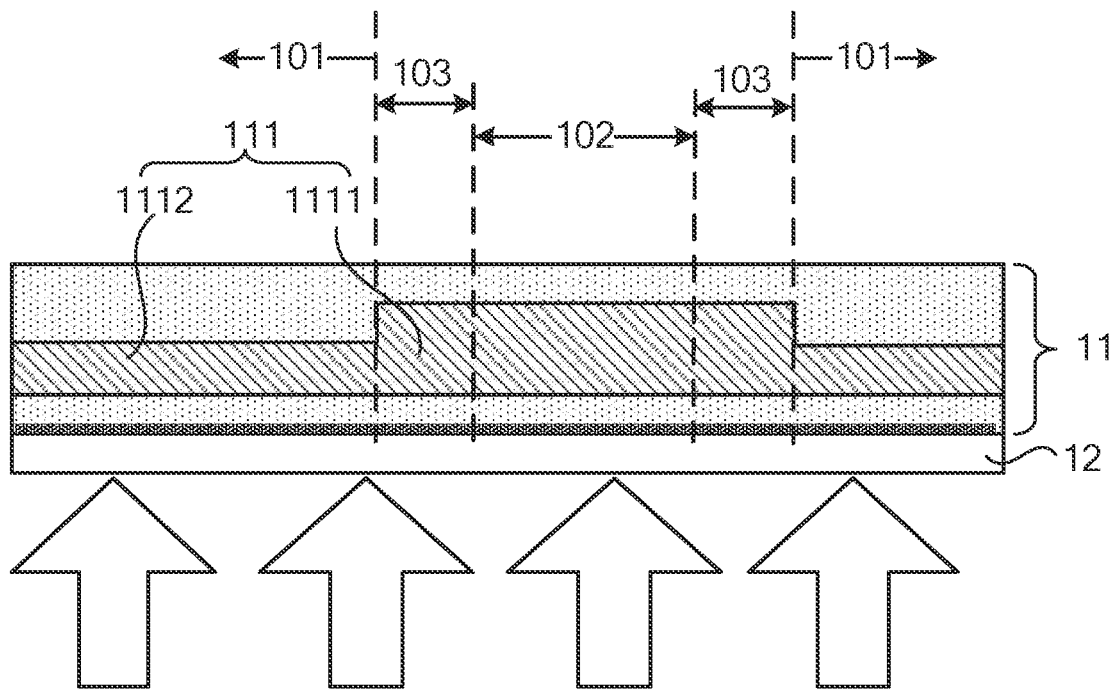
Figure 4C:
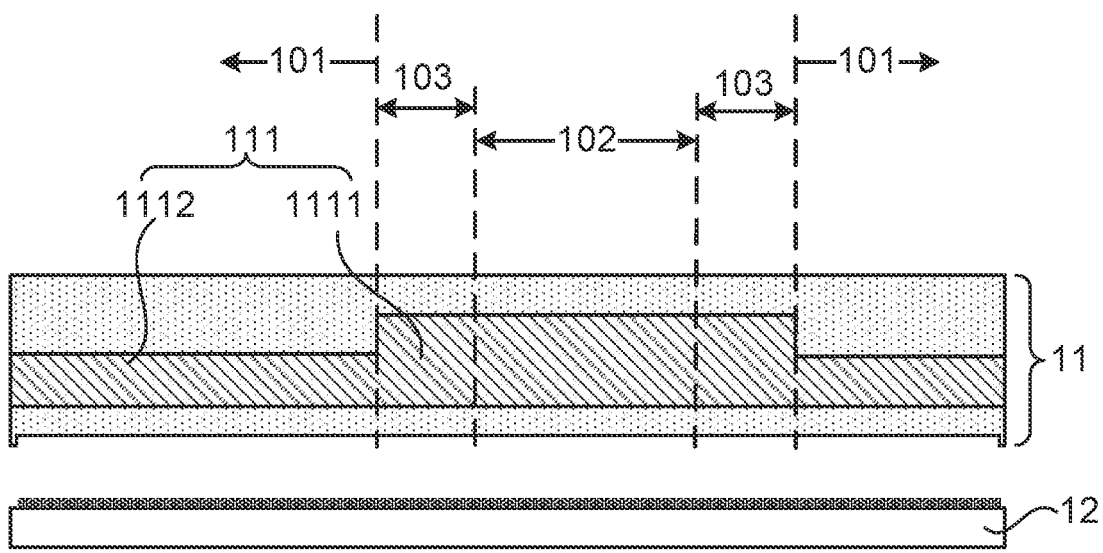

As shown in FIG. 4A, in a process of manufacturing the display substrate 10, the flexible base 11 is formed on a rigid carrier 12 (e.g., glass). After manufacture of film layers on the flexible base 11 is completed, the flexible base 11 is separated from the rigid carrier 12 by a laser lift-off (LLO) technology. For example, as shown in FIGS. 4A, 4B, and 4C, a penetrating laser beam (represented by the arrows from bottom to up in FIGS. 4A and 4B) is used to scan an interface of the flexible base 11 and the rigid carrier 12, and after a portion of the flexible base 11 (usually being a thin layer of a flexible film made of organic material) in direct contact with the rigid carrier 12 absorbs the laser energy to reache a pyrolysis temperature, a macromolecular compound in the portion of the flexible base 11 undergoes a chemical reaction and is converted to a low molecular compound, and then the low molecular compound is burned and gasified to be separated from other portions of the flexible base 11, thereby achieving the separation of the flexible base 11 and the rigid carrier 12; and then, the display substrate 10 is obtained by performing processes of opening and the like.

The display substrate 10 provided by the embodiments of the present disclosure further includes a functional film layer located on the flexible base 11, and a thickness of a portion of the functional film layer located in the display area 101 is greater than thicknesses of portions of the functional film layer located in the opening area 102 and the isolation area respectively.

Figure 6A:
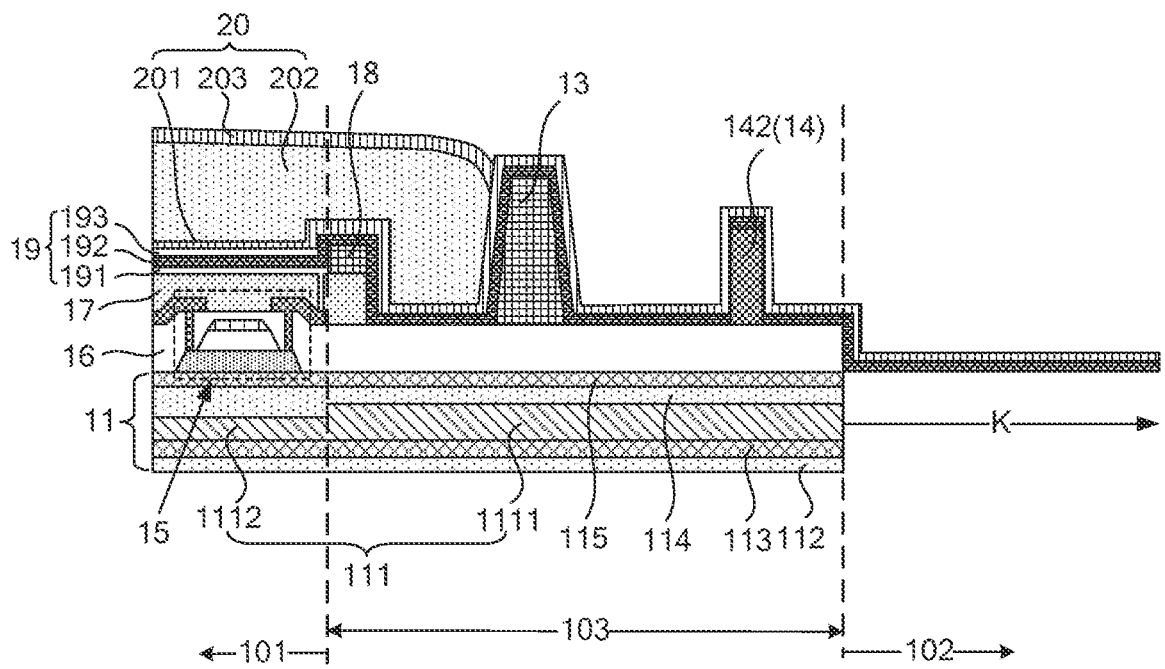
FIG. 6A is a sectional view of the display substrate taken along the line B-B' in FIG. 2A.
Figure 6B:
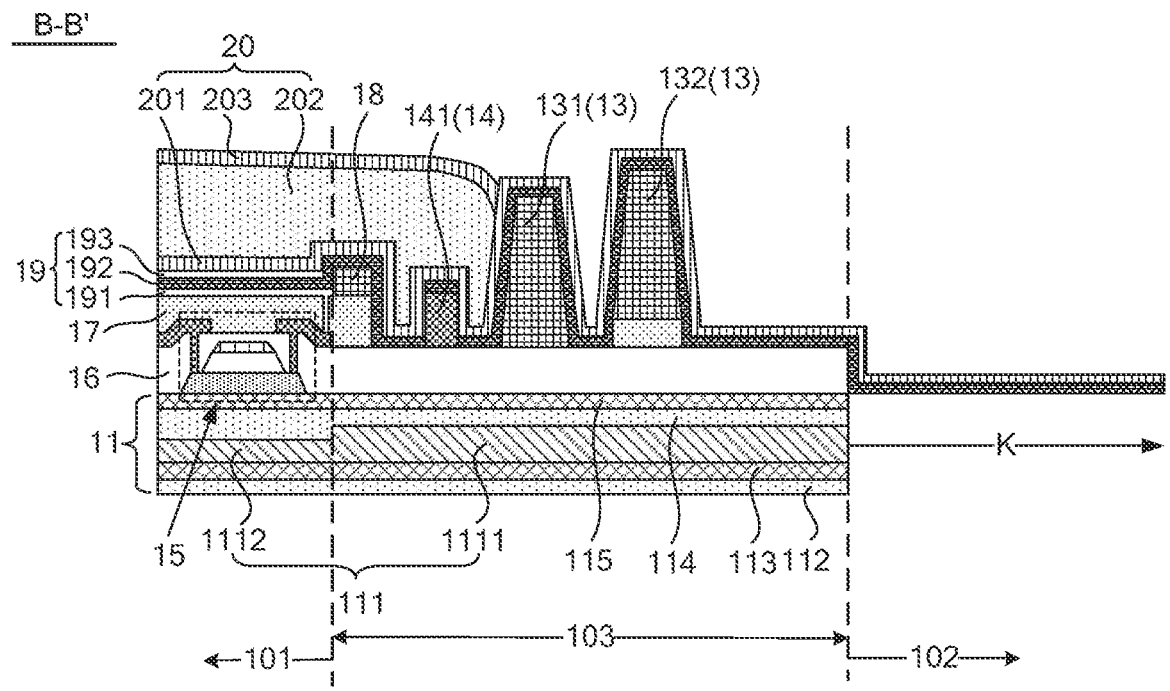
FIG. 6B is another sectional view of the display substrate taken along the line B-B' in FIG. 2A.
Figure 6C:
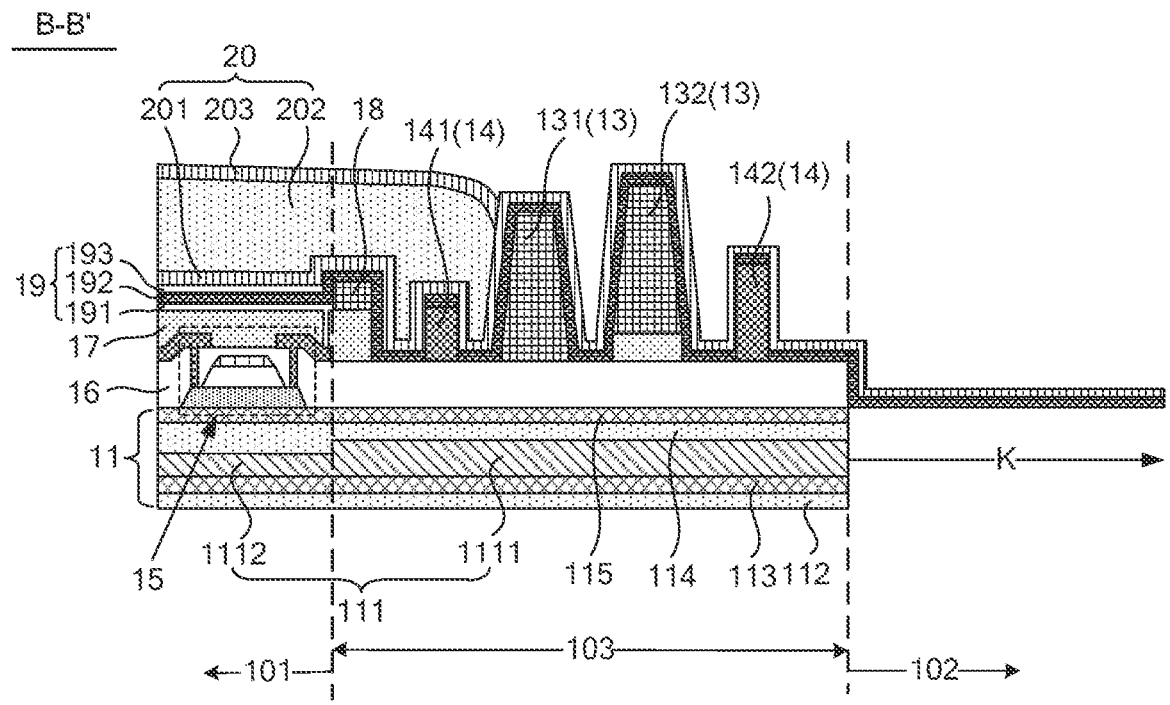
FIG. 6C is yet another sectional view of the display substrate taken along the line B-B' in FIG. 2A.

For example, as shown in FIGS. 6A, 6B and 6C, the functional film layer includes: an encapsulation layer 20 located in the display area 101, the isolation area 103 and opening area 102, and light-emitting devices 19 and pixel driving circuits 15 for driving the light-emitting devices 19 to emit light that are at least located in the display area 101, so that a display function of the electronic apparatus 1 is achieved. Each light-emitting device 19 includes an anode layer 191, a light-emitting functional layer 192 and a cathode layer 193 that are sequentially stacked.

For example, the light-emitting functional layer 192 may be located only in the display area 101 (that is, only the display area 101 may display images). For another example, the light-emitting functional layer 192 may also extend to the isolation area 103, or extend to the isolation area 103 and the opening area 102 as shown in FIGS. 6A to 6C (that is, the display area 101, the isolation area 103 and the opening area 102 may all display images).

Each pixel driving circuit 15 is composed of a plurality of film layers, such as a source-drain metal layer, a gate layer and a gate insulating layer, and at least some of the plurality of film layers are opaque. Therefore, the pixel driving circuit 15 is not provided in the opening area 102, so that an influence of partial opaque film layers in the pixel driving circuit 15 on image acquisition of the image sensor 05 may be avoid.

It will be seen from the above that, the number of film layers located in the isolation area 103 on the flexible base 11 is less than the number of film layers located in the display area 101 on the flexible base 11. Therefore, during the process of separating the display substrate 100 from the rigid carrier 12 by the laser lift-off technology, after the portion of the flexible base 11 in direct contact with the rigid carrier 12 absorbs the laser energy to reache the pyrolysis temperature, the macromolecular compound in the portion of the flexible base 11 is converted to a low molecular compound, and charged particles are generated during the low molecular compound is burned, and the charged particles erupt outward as a gas to form a plasma. In addition, a shock wave is generated when the plasma is formed, the shock wave will be reflected back to the display substrate 10 after it is transmitted to the rigid carrier 12, and each film layer in the display substrate 10 will absorb part of the energy of the reflected shock wave. Therefore, the portion of the display substrate 10, which is located in the isolation region 103 and has a smaller number of film layers, is subjected to more energy, so that inorganic film layers (e.g., insulating layers) in the portion are more easily separated from each other, resulting in a generation of a rainbow pattern.

In the embodiments of the present disclosure, since amorphous silicon (a-Si) is capable of converting to polysilicon (p-Si) by absorbing laser energy, the first portion 1111 of the amorphous silicon layer 111 can absorb more laser energy than the second portion 1112 of the amorphous silicon layer 111 by providing that the thickness of the first portion 1111 located in the isolation area 102 is greater than the thickness of the second portion 1112 located in the display area 10. In this way, the portion of the display substrate 10, which is located in the isolation region 103 and has a smaller number of film layers, may be subjected to less energy, and a risk of generating the rainbow pattern on the portion of the display substrate 10 located in the isolation area 103 is reduced when the display substrate 10 display images.

In addition, for a display substrate which does not include an amorphous silicon layer 111 having a non-uniform thickness, in a process of separating the display substrate from a rigid carrier by the laser lift-off technology, in order to avoid the generation of the rainbow pattern, it is necessary to use laser having appropriate energy (for example, power of the laser is in a range of 80 w to 130 w) to scan an interface between the display substrate and the rigid carrier multiple times, so that the separation of the display substrate and the rigid carrier are achieved. Compared with the display substrate, for the display substrate 10 provided by the embodiments of the present disclosure, laser having appropriate energy (for example, the power of the laser is in a range of 80 w to 130 w) may be used to scan the interface between the flexible base 11 and the rigid carrier 12 of the display substrate 10 only one time due to the amorphous silicon layer 111 having a non-uniform thickness in the above-described arrangement, so that the effective separation of the display substrate 10 and the rigid carrier 12 may be achieved. In this way, time for the process may be shortened and productivity may be increased.

In some embodiments, the thickness of the first portion 1111 of the amorphous silicon layer 120 located in the isolation area 103 is 1.3 times to 1.5 times the thickness of the second portion 1112 located in the display area 101, that is, the thickness of the first portion 1111 is 30% to 50% greater than the thickness of the second part 1112, such as 0%, 35%, 40%, 45%, or 50%. For example, the thickness of the second portion 1112 is 4 nanometers, and the thickness of the first portion 1111 is in a range of 5.2 nanometers to 6 nanometers.

Figure 5:
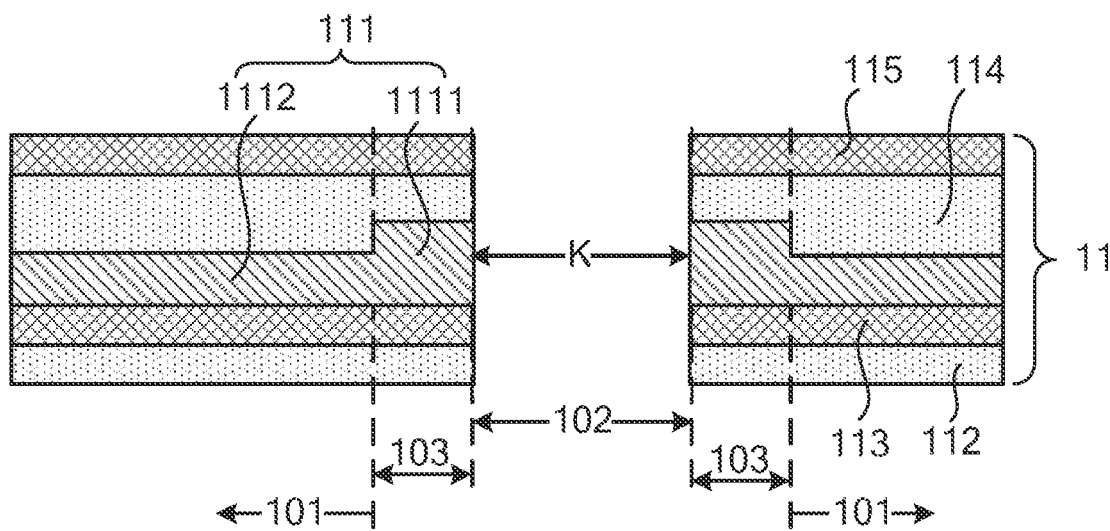
FIG. 5 is another sectional view of the flexible base in the display substrate taken along the line B-B' in FIG. 2A.

In some embodiments, as shown in FIG. 5, the flexible base 11 further includes a first flexible layer 112 disposed on a side of the amorphous silicon layer 111 and a first silicide layer 113 disposed between the first flexible layer 112 and the amorphous silicon layer 111. Since the flexible base 11 has the via hole K located in the opening area 102, it will be understood that the via hole K also penetrates through the first flexible layer 112 and the first silicide layer 113.

In addition, since some of film layers (e.g., the light-emitting functional layer 192) of the light-emitting device 19 in the display substrate 10 are formed by an evaporation process, a material forming the first flexible layer 110 not only needs to have good flexibility to meet bending requirements of the flexible base 11, but also needs to have good heat resistance and stability to enable some of the film layers of the light-emitting device 19 may be formed on the flexible base 11 by the evaporation process.

In some examples, a material of the first flexible layer 112 includes, but is not limited to, polyimide (PI). For example, the material of the first flexible layer 112 may also be polyester (PET), polycarbonate (PC) or the like.

In some examples, a material of the first silicide layer 113 includes, but is not limited to, silicon oxide. Since the amorphous silicon in the amorphous silicon layer 111 contains hydrogen atoms and is hydrophilic, the first silicide layer 113 may improve adhesion property of the first flexible layer 112 and the amorphous silicon layer 111 by treating a surface of the first silicide layer 113 made of silicon oxide.

For example, a material of the first silicide layer 113 may further include silicon nitride. That is, the first silicide layer 113 may be a single-layer structure formed of silicon oxide or silicon nitride, or may be a multi-layer structure in which a film layer formed of silicon oxide and a film layer formed of silicon nitride are alternately arranged. In this way, the first silicide layer 113 may be used to isolate moisture and oxygen, so as to prevent moisture and oxygen from intruding into the flexible base 11 and affecting film layers on the flexible base 11.

In some embodiments, as shown in FIG. 5, the flexible base 11 further includes a second flexible layer 114 disposed on a side of the amorphous silicon layer 111 away from the first silicide layer 113 and a second silicide layer 115 disposed on a side of the second flexible layer 114 away from the amorphous silicon layer 111. Since the flexible base 11 has the via hole K located in the opening area 102, it will be understood that the via hole K also penetrates through the second flexible layer 114 and the second silicide layer 115.

In some examples, the second flexible layer 114 is made of PI, PET or PC. In some embodiments of the present disclosure, the material of the second flexible layer 114 may be the same as or different from the material of the first flexible layer 112.

In some examples, the second silicide layer 115 is made of at least one of silicon oxide and silicon nitride. In some embodiments of the present disclosure, the material of the second silicide layer 115 may be the same as or different from the material of the first silicide layer 113.

In some embodiments, as shown in FIGS. 6A, 6B and 6C, the encapsulation layer 20 includes a first inorganic encapsulation layer 201, an organic encapsulation layer 202 and a second inorganic encapsulation layer 203. The first inorganic encapsulation layer 201, the organic encapsulation layer 202 and the second inorganic encapsulation layer 203 may prevent moisture and oxygen entering from the side of the display substrate 10 away from the flexible base 11 from intruding into the interior of the display substrate 10, and affecting the light-emitting devices 19 inside the display substrate 10. For example, an inorganic material of each of the first inorganic encapsulation layer 201 and the second inorganic encapsulation layer 203 includes at least one of silicon nitride and silicon oxide. The material of the first inorganic encapsulation layer 201 may be the same as or different from the second inorganic encapsulation layer 203. For example, an organic material of the organic encapsulation layer 202 is acrylic.

In some embodiments, as shown in FIGS. 6A, 6B, and 6C, the display substrate 10 further includes at least one blocking dam disposed on the flexible base 11 and in the isolation area 103. Since the organic material used to form the organic encapsulation layer 202 has certain fluidity in a film encapsulation process, the blocking dam 13 is provided in the isolation area 103 to intercept the organic material flowing toward a side close to the opening area 102, so that the organic encapsulation layer 202 and the second inorganic encapsulation layer 203 each extend only from the display area 101 to the isolation area 103, and do not extend to the opening area 102. In this way, after the via hole K is provided at least in a portion of the flexible base 11 located in the opening area 102, moisture and oxygen may be prevented from entering the inside of the display substrate 10 through the via hole K and affecting the light-emitting devices 19.

In some embodiments, as shown in FIG. 6A, the display substrate 10 includes one blocking dam 13.

In some other embodiments, the display substrate 10 includes a plurality of blocking dams 13 arranged at intervals in a direction from the display area 101 to the opening area 102. For example, as shown in FIGS. 6B and 6C, the display substrate 10 includes two blocking dams 13 arranged at intervals. For the convenience of description, the two blocking dams are referred to as a first blocking dam 131 and a second blocking dam 132, respectively.

In some examples, heights of the plurality of blocking dams 13 gradually increase in the direction from the display area 101 to the opening area 102. For example, as shown in FIGS. 6B and 6C, the second blocking dam 132 is closer to the opening area 102 than the first blocking dam 131, and the height of the second blocking dam 132 is greater than the height of the first blocking dam 131. However, the embodiments of the present disclosure do not limit the heights of the two blocking dams 13, and the height of the second blocking dam 132 may also be equal to or less than the height of the first blocking dam 131.

In this way, the second blocking dam 132 may further block the organic material forming the organic encapsulation layer 21 from spreading toward the opening area 102.

In some embodiments, as shown in FIGS. 6A, 6B and 6C, the display substrate 10 further includes an insulating layer 16. The insulating layer 16 may include the gate insulating layer in the pixel driving circuit 15. Of course, the insulating layer 16 may further include other insulating film layers, such as one of a dielectric layer, a buffer layer and a blocking layer. The at least one blocking dam 13 is provided on a side of the insulating layer 16 away from the flexible base 11.

In some embodiments, as shown in FIGS. 6A, 6B and 6C, the display substrate 10 further includes a planarization layer and a pixel defining layer 18. The planarization layer 17 is disposed between the pixel driving circuit 15 and the light-emitting device 19, and is only located in the display area 101 and the isolation area 103. The planarization layer 17 has a certain thickness, which can form a flatten surface after covering on the pixel driving circuits 15, so as to facilitate subsequent manufacture of the light-emitting devices 19. A material of the planarization layer 17 may be, for example, photosensitive polyimide, but the embodiments of the present disclosure do not limit thereto. The pixel defining layer 18 is disposed on a side of the planarization layer 17 away from the flexible base 11, and at least in the display area 101 and the isolation area 103. The pixel defining layer 18 is used to isolate adjacent light-emitting devices 19 to avoid short-circuit. A material of the pixel defining film 18 may be, for example, a photoresist. A material of the photoresist may include one or more of polyimide, organosilane and polymethyl methacrylate.

In some embodiments, the blocking dam(s) 13 is disposed in the same layer as the pixel defining layer 17.

In some other embodiments, in a case where the display substrate 10 includes the first blocking dam 131 and the second blocking dam 132 as shown in FIGS. 6B and 6C, the first blocking dam 131 may be disposed in the same layer as the pixel defining layer 18, a portion of the second blocking dam 132 may be disposed in the same layer as the planarization layer 17, and the other portion of the second blocking dam 132 may be disposed in the same layer as the pixel defining layer 18. In this way, a manufacturing process of the display substrate 10 is simplified.

In the embodiments of the present disclosure, the term "same layer" refers to a layer structure formed through a same patterning process by using a same mask in which a film layer for forming specific patterns is formed by using a same film-forming process. Depending on different specific patterns, the same patterning process may include exposure, development and etching, and the specific patterns formed in the layer structure may be continuous or discontinuous, and these specific patterns may also be at different heights or have different thicknesses.

Figure 7:
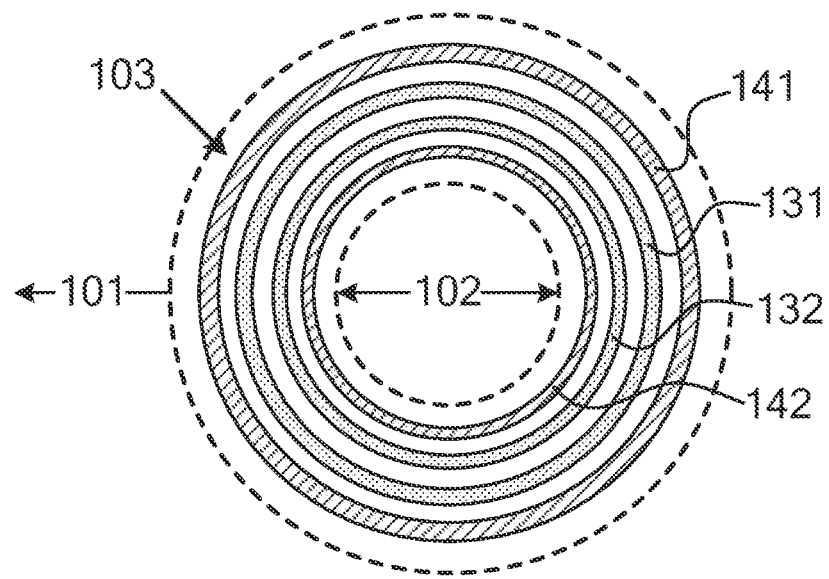
FIG. 7 is a top view of blocking dams and separation pillars in the display substrate in FIG. 6C.

In the embodiments of the present disclosure, the at least one blocking dam 13 is arranged at least partially around the opening area 102, so that the organic encapsulation layer 202 and the second inorganic encapsulation layer 203 are each extend only from the display area 101 to the isolation area 103, and do not extend to the opening area 102, and moisture and oxygen are prevented from entering the inside of the display substrate 10 through the via hole K. In some examples, the at least one blocking dam 13 is in a shape of a ring, and is disposed around the opening area 103 to prevent moisture and oxygen from entering the inside of the display substrate 10 through the via hole K. For example, the at least one blocking dam 13 is in a shape of a circular ring, which is not limited in the embodiments of the present disclosure. In addition, in a case where the display substrate 10 includes a plurality of blocking dams 13, the shapes of the blocking dams 13 may be the same or different. For example, as shown in FIG. 7, the display substrate 10 includes the first blocking dam 131 and the second blocking dam 132, and the shape of the first blocking dam 131 is the same as the shape of the second blocking dam 132.

In some embodiments, as shown in FIGS. 6A, 6B and 6C, the display substrate 10 further includes at least one separation pillar disposed on the flexible base 11 and in the isolation area 103. The embodiments of the present disclosure do not limit the number of the separation pillar, which may be one or more.

For example, the display substrate 10 includes one separation pillar 14. As shown in FIG. 6A, the separation pillar 14 is located between the blocking dam 13 and the opening area 102; or, as shown in FIG. 6B, the separation pillar 14 is located between the blocking dam 13 and the display area 101. For another example, the display substrate 10 includes two separation pillars 14. As shown in FIG. 6C, one separation pillar is located between the blocking dam 13 and the display area 101, and the other separation pillar is located between the blocking dam 13 and the opening area 102.

In some examples, the separation pillar 14 is disposed in the same layer as a source-drain metal layer in the pixel driving circuit 15 located in the display area 101. For example, the separation pillar 14 and the source-drain metal layer are both made of titanium (Ti) and aluminum (Al). An example is taken in which the source-drain metal layer is a three-layer stacked structure of Ti sub-layer, Al sub-layer and Ti sub-layer stacked (i.e., Ti/Al/Ti), a portion of the separation pillar 14 is made of Ti and is disposed in the same layer as the Ti sub-layer in the source-drain metal layer, and another portion of the separation pillar 14 is made of Al and is disposed in the same layer as the Al sub-layer in the source-drain metal layer, and yet another portion of the separation pillar 14 is made of Ti and disposed in the same layer as the Ti sub-layer in the source-drain metal layer. That is, the separation pillar 14 is also a three-layer stacked structure of Ti sub-layer, Al sub-layer and Ti sub-layer stacked (i.e., Ti/Al/Ti).

For the convenience of description, the separation pillar 14 located between the blocking dam 13 and the display area 101 is referred to as a first separation pillar 141, and the separation pillar 14 located between the blocking dam 13 and the opening area 102 is referred to as a second separation pillar 142.

The first separation pillar 141 is mainly used to separate the light-emitting functional layer 192 located in the display area 101 and the light-emitting functional layer 192 located in the opening area 102, so as to prevent service life of the light-emitting devices 19 from being shortened due to moisture and oxygen entering the light-emitting functional layer 192 in the display area 10 through the light-emitting functional layer 192 of the opening area 102.

In a process of punching the via hole in the portion of the display substrate 10 located in the opening area 103 through a cutting technology, there may be a risk that film layers in the display substrate 10 will be broken due to the stress generated during the cutting process. Based on this, the second separation pillar 142 is arranged between the blocking dam 13 and the opening area 102, so that a path of breaking of film layers (e.g., the light-emitting functional layer 192 and the second inorganic encapsulation layer 22) disposed on a side of the second separation pillar 142 away from the flexible base 11 is extended. In other words, the second separation pillar 142 is mainly used to prevent the film layers disposed on the side of the second separation pillar 142 away from the flexible base 11 from breaking.

In some examples, the first separation pillar 141 is in a shape of a ring and is disposed around the opening area 102, so as to achieve the function of separating the light-emitting functional layer 192. In some other examples, the second separation pillar 142 is in a shape of a ring, so as to achieve the function of blocking the breaking of the film layers disposed on the side of the second separation pillar 142 away from the flexible base 11. The embodiments of the present disclosure do not limit the shapes of the first separation pillar 141 and the second separation pillar 142, as long as it is ensured that the first separation pillar 141 and the second separation pillar 142 are arranged around the opening area 102.

In a case where the display substrate 100 includes the first separation pillar 141 and the second separation pillar 142, the shape of the first separation pillar 141 is the same as or different from the shape of the second separation pillar 142. For example, as shown in FIG. 7, the first separation pillar 141 and the second separation pillar 142 are both in a shape of a circular ring.

In addition, the height of the second separation pillar 142 is greater than the height of the first separation pillar 141, so that the path of the breaking of the film layers (e.g., the light-emitting functional layer 192 and the second inorganic encapsulation layer 22) disposed on the side of the second separation pillar 142 away from the flexible base 11 is further extended, and a risk of the breaking of the film layers disposed on the side of the second separation pillar 142 away from the flexible base 11 during the punching process is further reduced. Furthermore, for example, the first separation pillar 141 is arranged in the same layer as the source-drain metal layer, a portion of the second separation pillar 142 may be arranged in the same layer as the source-drain metal layer, and another portion of the second separation pillar 142 may be arranged in the same layer as another layer, so that the height of the second separation pillar 142 is greater than the height of the first separation pillar 141.

The embodiments of the present disclosure do not limit the number of the first separation pillar 141, which may be one or more. In a case where the display substrate 10 includes a plurality of first separation pillars 141, the plurality of first separation pillars 141 are arranged at intervals between the blocking dam 13 and the display area 101. Moreover, the shapes of the plurality of first separation pillars 141 may be the same or different.

The embodiments of the present disclosure do not limit the number of the second separation pillar 142, which may be one or more. In a case where the display substrate 10 includes a plurality of second separation pillars 142, the plurality of second separation pillars 142 are arranged at intervals between the blocking dam 13 and the opening area 102. Moreover, the shapes of the plurality of second separation pillars 142 may be the same or different.

Some embodiments of the present disclosure provide a method of manufacturing a display substrate 10. The method includes the following steps.

Figure 8A:
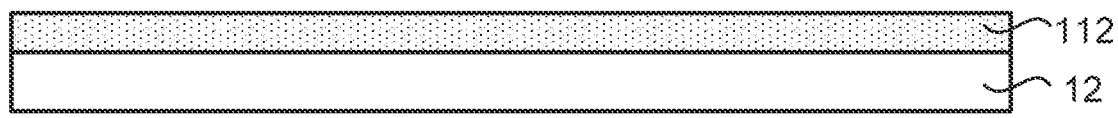
FIGS. 8A to 8J are schematic diagrams showing a manufacturing process of a display substrate, in accordance with some embodiments.

In step 1 (S1), as shown in FIG. 8A, a rigid carrier 12 is provided. For example, the rigid carrier 12 is a glass.

In step 2 (S2), a flexible base 11 is formed on the rigid carrier 12.

In some embodiments, S2 includes following the sub-steps.

In sub-step 21 (S21), as shown in FIG. 8A, a first flexible layer 112 is formed on the rigid carrier 12. For example, the rigid carrier 12 is coated with a material, e.g., PI, forming the first flexible layer 112, and the material is dried to form the first flexible layer 112.

Figure 8B:
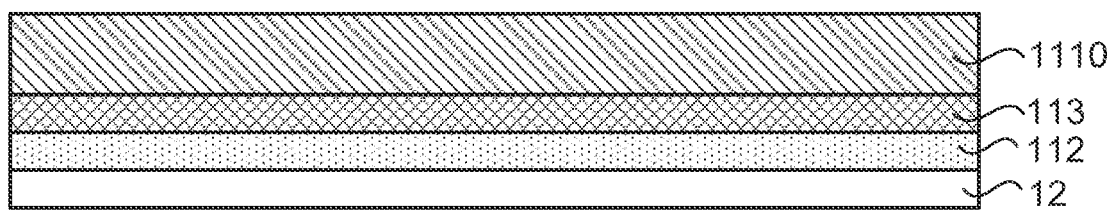

In sub-step 22 (S22), as shown in FIG. 8B, a first silicide layer 113 and an amorphous silicon layer to be processed 1110 are sequentially formed on the first flexible layer 112. For example, silicon oxide is deposited on the first flexible layer 112 by a chemical vapor deposition (CVD) equipment to form the first silicide layer 113; then, an amorphous silicon material is deposited on the first silicide layer 113 by a CVD equipment to form the amorphous silicon layer to be processed 1110.

Figure 8C:
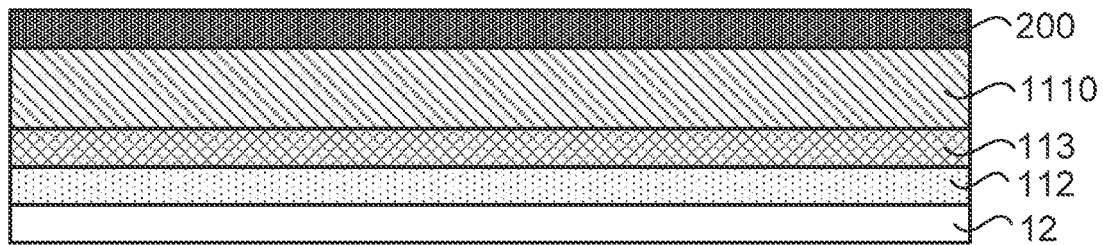
Figure 8D:
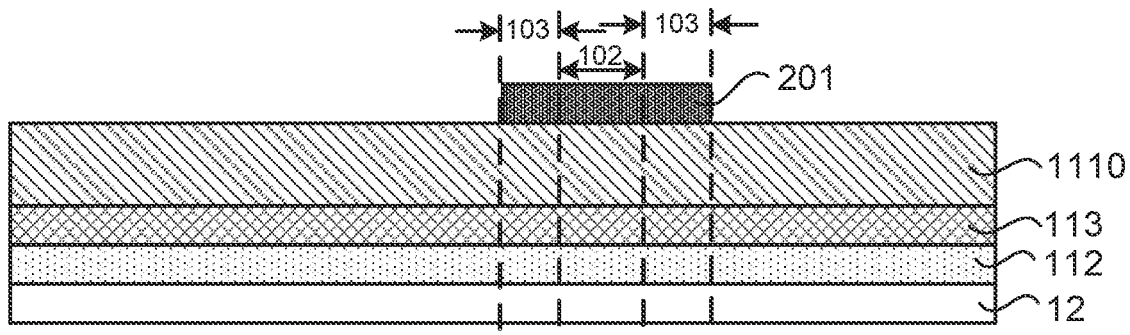

In sub-step 23 (S23), as shown in FIG. 8C, a mask layer 200 is formed on a surface of the amorphous silicon layer to be processed 1110. For example, a photoresist layer (i.e., the mask layer 200) is formed on the surface of the amorphous silicon layer to be processed 1110 through a coating manner. Then, as shown in FIG. 8D, an exposure and development process is performed to retain a predetermined pattern 201 located both in the isolation area 103 and the opening area 102. For example, the predetermined pattern 201 is a circular pattern composed of the opening area 102 and the isolation area 103 shown in FIG. 2B. That is, the predetermined pattern 201 covers portions, located in the isolation area 103 and the opening area 102, of the amorphous silicon layer to be processed 1110. Then, an etching process is performed to remove the material with a certain thickness of a portion, non-covered by the predetermined pattern 201, of the amorphous silicon layer to be processed 1110, so that a first portion 1111 located in the isolation area 103, a second portion 1112 located in the display area 101 and a third portion 1113 located in the opening area 102 is formed, so that an amorphous silicon layer 111 is formed.

In some examples, after removing the material with a certain thickness of the portion, non-covered by the predetermined pattern 201, of the amorphous silicon layer to be processed 1110, thicknesses of the first portion 1111 located in the isolation area 103 and the third portion 1113 located in the opening area 102 are greater than a thickness of the second portion 1112, and the thickness of the first portion 1111 is equal to the thickness of the third portion 1113. In this way, the first portion 1111 and the third portion 1113 may absorb more laser energy than the second part 1112 to cause the material of the amorphous silicon layer to be processed 1110 to be converted from a-Si to p-Si, so that a case where inorganic film layers (e.g., the light-emitting functional layer 192 and the first inorganic encapsulation layer 201) are peeling off from each other may be avoided during the process of separating the display substrate 10 from the rigid carrier 12 by the laser lift-off technology.

For example, the thickness of the third portion 1113 located in the opening area 102 is 1.3 to 1.5 times the thickness of the second portion 1112 located in the display area 101. That is, the thickness of the third portion 1113 is 30% to 50% greater than the thickness of the second portion 1112. For example, the thickness of the second portion 1112 is 4 nanometers, and the thickness of the third portion 1113 is in a range of 5.2 nanometers to 6 nanometers.

Figure 8E:
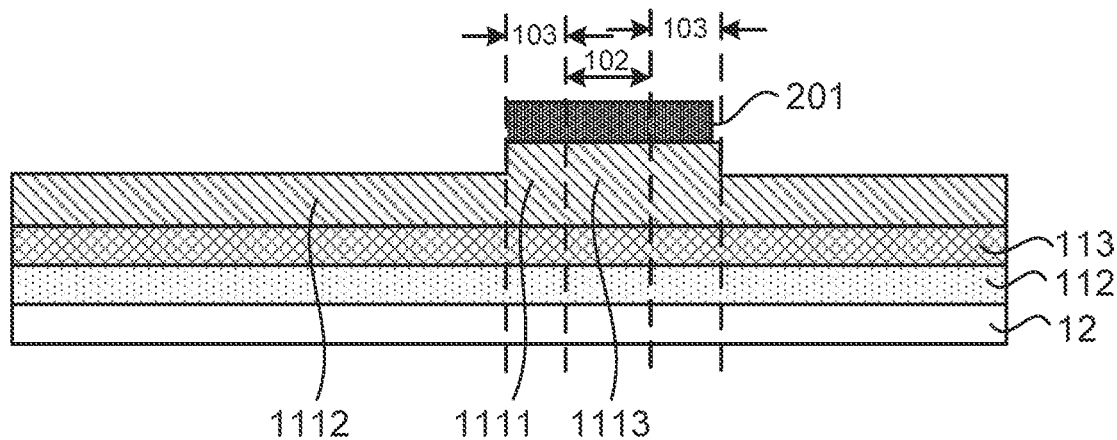

FIG. 8E is illustrated by an example in which the thickness of the third portion 1113 is equal to the thickness of the first portion 1111. In this way, the manufacturing process of the flexible base 11 may be simplified. For example, after S22 is completed, a thickness of the amorphous silicon layer to be processed 1110 is 6 nanometers. In the etching process of the sub-step S23, the material with the thickness of 2 nanometers of the portion, non-covered by the predetermined pattern 201, of the amorphous silicon layer to be processed 1110 is removed, so as to obtain the amorphous silicon layer having a thickness of 4 nanometers for the second portion 1112 and 6 nanometers for both the first portion 1111 and the third portion 1113.

Figure 8F:
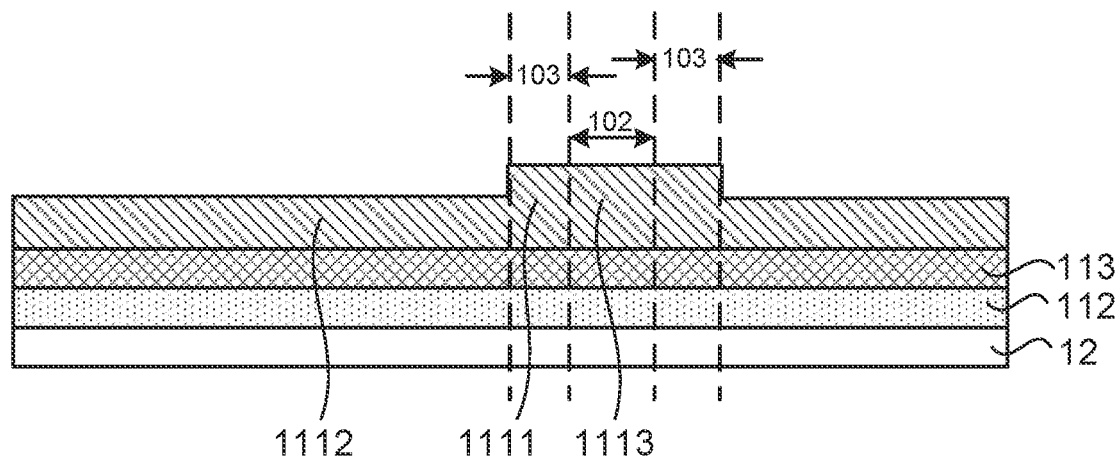

In the embodiments of the present disclosure, the etching process may be a dry etching process or a wet etching process. After the etching process is completed, the predetermined pattern 201 is removed to form the structure shown in FIG. 8F.

Figure 8G:
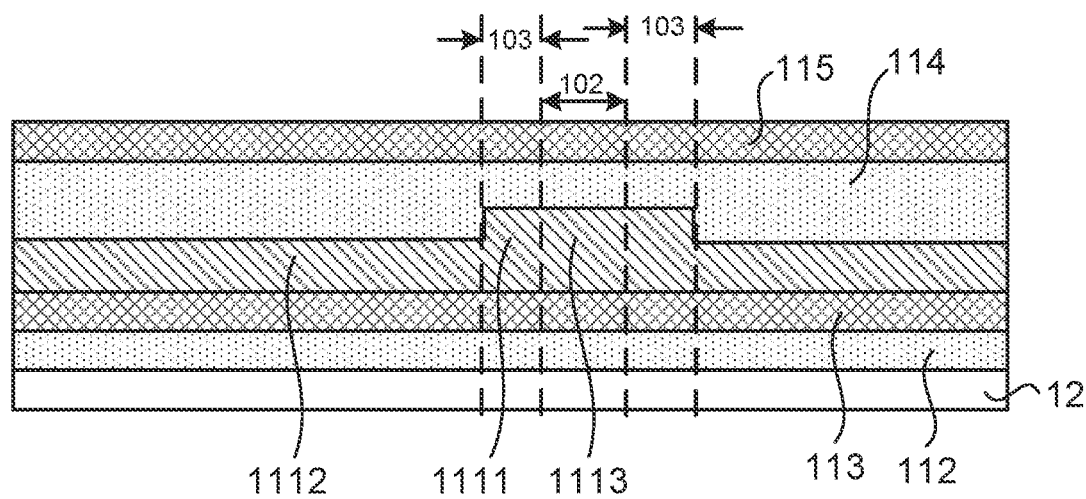

In sub-step 24 (S24), as shown in FIG. 8G, a second flexible layer 114 and a second silicide layer 115 are sequentially formed on the amorphous silicon layer 111.

A method for forming the second flexible layer 114 may be the same as the method for forming the first flexible layer 112, and a method for forming the second silicide layer 115 may be the same as the method for forming the first silicide layer 113.

Figure 8H:
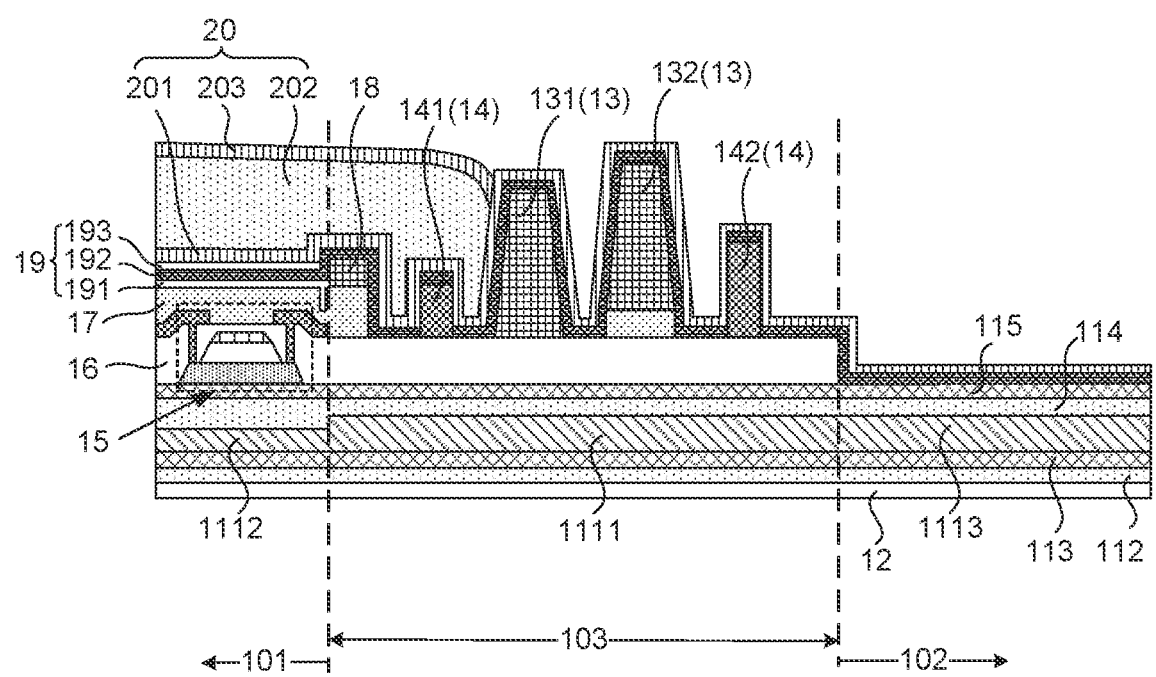

In this way, the manufacturing of the flexible base 11 is finished, and other film layers, such as an insulating layer 16, pixel driving circuits 15, a planarization layer 17, a pixel defining layer 18, light-emitting devices 19, blocking dams 13, separation pillars 14 and an encapsulation layer 20 (e.g., a first inorganic encapsulation layer 20, an organic encapsulation layer 21 and a second inorganic encapsulation layer 22), may be formed on the flexible base 11 in subsequent processes to form the structure as shown in FIG. 8H. It will be noted that, for clarity of illustration, FIG. 8H only illustrates the structure of the display substrate 10 in the partial display area 101, the isolation area 103 and the opening area 102.

Figure 8I:
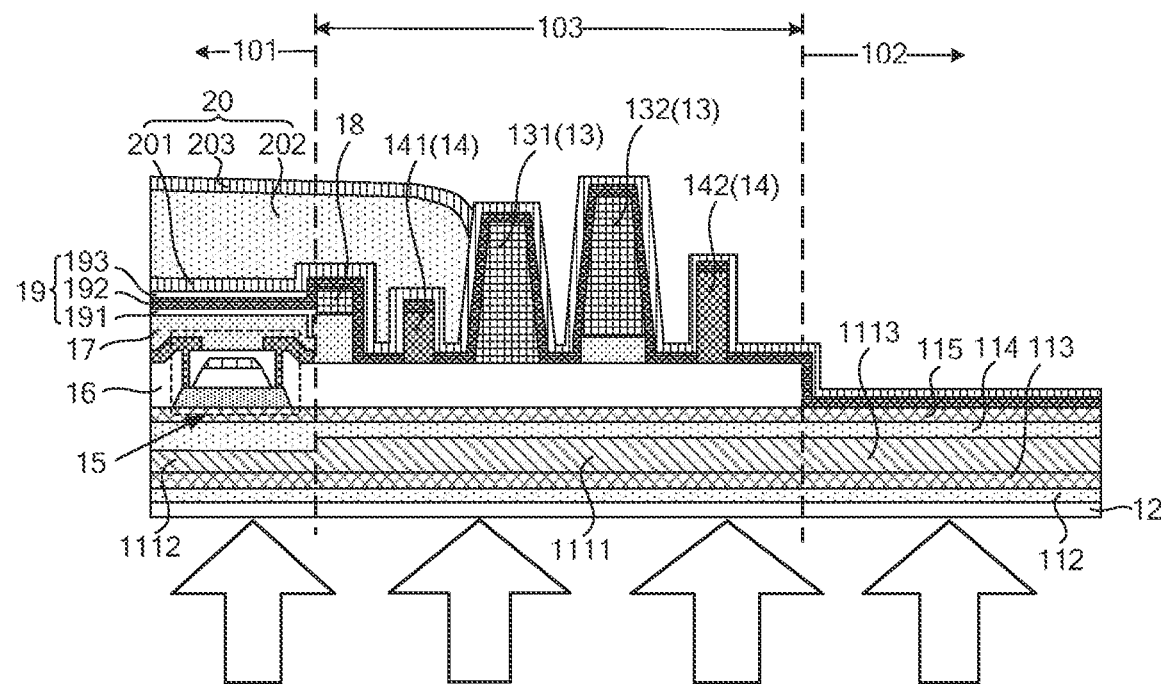
Figure 8J:
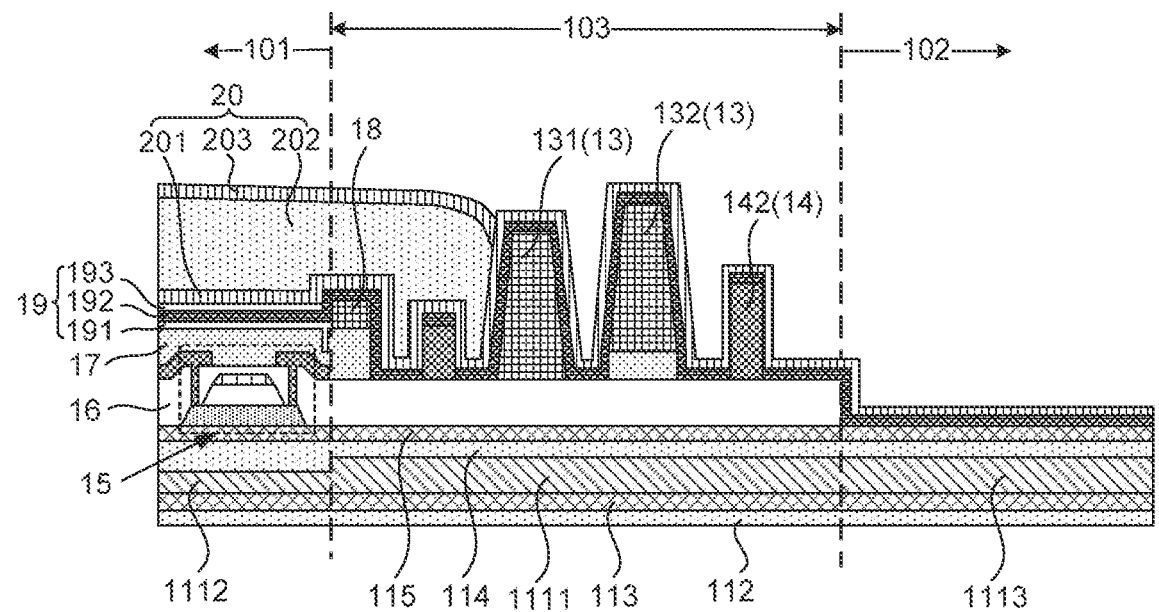

In step 3 (S3), as shown in FIG. 8I, a laser (represented by the arrows from bottom to up) is used to scan a surface of the rigid carrier 12 away from the flexible base 11 once to separate the rigid carrier 12 from the flexible base 11, thereby forming a display substrate motherboard as shown in FIG. 8J.

For example, a power of the laser is in a range of 80 w 130 w, and a scanning speed is about 2000 mm/s.

In step 4 (S4), the display substrate motherboard is cut, and then a portion of the display substrate motherboard located in the opening area 102 is performed a punching process. Alternatively, it is also possible to perform the punching process on the portion of the display substrate motherboard located in the opening area 102 first, and then cut the display substrate motherboard, so as to obtain a separate display substrate 10.

Performing the punching process on the portion of the display substrate motherboard located in the opening area 102 may be, for example, removing at least the third portion 1113 of the amorphous silicon layer to be processed 1110 located in the opening area 102 and portions, located in the opening area 102 and corresponding to the third portion 1113, of the first flexible layer 112, the first silicide layer 113, the second flexible layer 114 and the second silicide layer 115 of the flexible base 11 by means of laser drilling, so as to form the via hole K located in the opening area 102 in the flexible base 11, so that the image sensor 05 may be installed at least in the via hole K.

For example, all film layers of the portion of the display substrate motherboard located in the opening area 102 are removed to form a via hole K penetrating through the display substrate motherboard, that is, the via hole K penetrating through the flexible base 11 also penetrates through the film layers of the display substrate 10 on the flexible base 11. For another example, as shown in FIG. 6C, only the third portion 1113 of the amorphous silicon layer to be processed 1110 located in the opening area 102 and the portions, located in the opening area 102 and corresponding to the third portion 1113, of the first flexible layer 112, the first silicide layer 113, the second flexible layer 114 and the second silicide layer 115 of the flexible base 11 are removed. That is, as for the display substrate 10, the via hole K penetrating through the flexible base 11 is a blind hole and extends below the light-emitting functional layer 192.

The method of the display substrate provided by the embodiments of the present disclosure has the same beneficial effects as the above display substrate 10, which will not be repeated herein.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A display substrate having a display area, an opening area, and an isolation area located between the display area and the opening area and surrounding the opening area, the display area being disposed at least partially around the opening area; the display substrate comprising:
    a flexible base having a via hole located in the opening area, including:
        an amorphous silicon layer including a first portion located in the isolation area and a second portion located in the display area, and a thickness of the first portion being greater than a thickness of the second portion.

2. The display substrate according to claim 1, wherein the thickness of the first portion is 1.3 to 1.5 times the thickness of the second portion.

3. The display substrate according to claim 1, further comprising at least one blocking dam disposed on the flexible base and located in the isolation area.

4. The display substrate according to claim 3, wherein the at least one blocking dam is in a shape of a ring, and is disposed around the opening area.

5. The display substrate according to claim 3, wherein the at least one blocking dam includes a plurality of blocking dams arranged at intervals in a direction from the display area to the opening area.

6. The display substrate according to claim 3, wherein heights of the plurality of blocking dams increase in the direction from the display area to the opening area.

7. The display substrate according to claim 3, further comprising at least one separation pillar disposed on the flexible base and located in the isolation area.

8. The display substrate according to claim 7, wherein the at least one separation pillar includes one separation pillar, the separation pillar is located between the at least one blocking dam and the display area or between the at least one blocking dam and the opening area.

9. The display substrate according to claim 7, wherein the at least one separation pillar includes a first separation pillar and a second separation pillar disposed at intervals;
the first separation pillar is located between the at least one blocking dam and the display area, and the second separation pillar is located between the at least one blocking dam and the opening area.

10. The display substrate according to claim 9, wherein a height of the second separation pillar is greater than a height of the first separation pillar.

11. The display substrate according to claim 7, wherein the at least one separation pillar is in a shape of a ring, and is disposed around the opening area.

12. The display substrate according to claim 1, wherein the flexible base further includes:
a first flexible layer disposed on a side of the amorphous silicon layer; and
a first silicide layer disposed between the first flexible layer and the amorphous silicon layer.

13. The display substrate according to claim 12, wherein a material of the first silicide layer includes silicon oxide.

14. The display substrate according to claim 12, wherein a material of the first flexible layer includes polyimide.

15. The display substrate according to claim 12, wherein the flexible base further includes:
a second flexible layer disposed on a side of the amorphous silicon layer away from the first silicide layer; and
a second silicide layer disposed on a side of the second flexible layer away from the amorphous silicon layer.

16. The display substrate according to claim 15, wherein a material of the second flexible layer includes polyimide.

17. The display substrate according to claim 15, wherein a material of the second silicide layer includes silicon oxide.

18. A method of manufacturing a display substrate, the display substrate being the display substrate according to claim 1, the method comprising:
providing a rigid carrier; and
forming a flexible base on the rigid carrier, including:
forming an amorphous silicon layer to be processed, wherein the amorphous silicon layer to be processed includes the first portion located in the isolation area, the second portion located in the display area and a third portion located in the opening area, thicknesses of the first portion and the third portion are both greater than the thickness of the second portion;
scanning a surface of the rigid carrier away from the amorphous silicon layer to be processed once through a laser to separate the flexible base from the rigid carrier; and
removing the third portion to form the amorphous silicon layer.

19. The method according to claim 18, wherein the thickness of the third portion is 1.3 to 1.5 times the thickness of the second portion.

20. The method according to claim 19, wherein the thickness of the third portion is equal to the thickness of the first portion.

* * * * *